United States Patent
Hsiao

(10) Patent No.: US 11,602,065 B1
(45) Date of Patent: Mar. 7, 2023

(54) WATERPROOF STRUCTURE OF ELECTRONIC DEVICE

(71) Applicant: Delta Electronics, Inc., Taoyuan (TW)

(72) Inventor: Wei-Kai Hsiao, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 17/540,071

(22) Filed: Dec. 1, 2021

(30) Foreign Application Priority Data

Oct. 13, 2021 (CN) .......................... 202111193785.5

(51) Int. Cl.
  *H05K 5/02* (2006.01)
  *H05K 5/06* (2006.01)

(52) U.S. Cl.
  CPC .......... *H05K 5/062* (2013.01); *H05K 5/0247* (2013.01)

(58) Field of Classification Search
  None
  See application file for complete search history.

(56) References Cited

U.S. PATENT DOCUMENTS

| | | | | |
|---|---|---|---|---|
| 6,492,590 B1 * | 12/2002 | Cheng | ................ | H01R 13/6658 52/27 |
| 7,358,438 B2 * | 4/2008 | Zoller | ................. | H05K 7/1417 174/50 |
| 8,648,264 B2 * | 2/2014 | Masumoto | ............... | H02G 3/14 220/281 |
| 8,687,374 B2 * | 4/2014 | Watanabe | ........... | H05K 5/0052 361/752 |
| 10,148,074 B1 * | 12/2018 | Matsumura | .......... | H05K 5/0221 |
| 10,645,821 B1 * | 5/2020 | Cheng | .................. | H01R 13/516 |
| 2007/0230143 A1 * | 10/2007 | Inagaki | .................. | H05K 5/062 361/752 |
| 2014/0062399 A1 * | 3/2014 | Moon | ..................... | B60L 53/30 320/109 |
| 2014/0182928 A1 * | 7/2014 | Starke | .................. | H02G 15/117 174/152 G |
| 2016/0091682 A1 * | 3/2016 | Wakileh | ............... | G02B 6/4452 439/529 |
| 2018/0312122 A1 * | 11/2018 | Kakimi | ............... | B60R 16/0238 |
| 2020/0153213 A1 * | 5/2020 | Kakimi | .................. | H02G 3/081 |
| 2021/0127519 A1 * | 4/2021 | Thrailkill | ............... | H05K 5/061 |

FOREIGN PATENT DOCUMENTS

CN 102984905 B 8/2016

* cited by examiner

*Primary Examiner* — Xanthia C Cunningham
(74) *Attorney, Agent, or Firm* — Chun-Ming Shih; HDLS IPR Services

(57) ABSTRACT

This disclosure provides a waterproof structure of an electronic device having a box, a cable, a sealant, and a cover. The box has an opening and a groove defined on the box along an edge of the opening, the groove is extended in a closed curve manner, and an outer through opening communicated with the groove is defined on an external surface of the box and the groove has an inner through opening communicated with an internal space of the box. An outer baffle and an inner baffle respectively corresponding to the outer and the inner through opening are arranged on the cable, the cable penetrates the box through the outer and the inner through opening, and the outer and the inner baffle respectively close the outer and the inner through opening. The sealant is filled in the groove. The cover body covers the opening and closes the groove.

19 Claims, 14 Drawing Sheets

WATERPROOF STRUCTURE OF ELECTRONIC DEVICE

BACKGROUND OF THE DISCLOSURE

Technical Field

This disclosure is directed to a potting waterproof structure of an electronic device, and in particular to a waterproof structure of an electronic device having a cable penetrating a potting runner.

Description of Related Art

Some related methods used for waterproofing a housing are: internal potting, sealing strip disposed at an opening, ultrasonic welding applied on an opening and Cured-In-Place Gasket/Formed-In-Place Gasket (CIPG/FIPG) applied on an opening.

Regarding the aforementioned waterproof structures, potting a product with sealant has a good sealing performance, but the weight of the product may be significantly increased by a large amount of the sealant. Therefore, it is not suitable for mobile products.

Arranging a sealing ring into the product and compressing the sealing ring by assembling can achieve a waterproof effect. It needs a manually assembling process, the assembling process is time consuming and may cause mistakes.

Ultrasonic welding the housing is a cheap and easy process. However, waterproof effect is poor by this process, the process is only suitable for plastic casing, and not suitable for big products.

In a CIPG/FIPG process, a paste sealant is extruded along a periphery of an opening on the product to form a strip with a uniform cross-section, and parts of the product are further adhered together in an assembling process. This process is time consuming and may cause excess glue on appearance of the product. The extruded sealant cannot be applied on an overlength route or a complex route, otherwise the strip may be broken and the sealant may be leaked. The extruded uniform sealant strip is only suitable for a plane or a runner with a uniform cross-section and it should not be disposed across a cable. Accordingly, the cable should penetrate the product through another portion and an additional waterproof structure for the cable is therefore required.

In view of the above drawbacks, the inventor proposes this disclosure based on his expert knowledge and elaborate researches in order to solve the problems of related art.

SUMMARY OF THE DISCLOSURE

This disclosure is directed to a runner potted waterproof structure of an electronic device having a cable penetrating a potting runner.

A waterproof structure of an electronic device is provided in this disclosure. The waterproof structure has a box, a cable, a sealant, and a cover. The box has an opening, the box is provided with a groove extended along an inner periphery of the opening, the groove is extended in a closed curve manner, an outer through opening is defined on an external surface of the box communicating with the groove, the groove is provided with an inner through opening communicating with an internal space of the box, the box has a housing and an inner frame, the opening is defined on the housing, and the inner frame is arranged on the inner periphery of the opening. An outer baffle and an inner baffle are arranged on the cable respectively corresponding to the outer through opening and the inner through opening, the cable penetrates the box through the outer through opening and the inner through opening, and the outer through opening and the inner through opening are respectively closed by the outer baffle and the inner baffle. The sealant is filled in the groove. The cover covers the opening and closes the groove.

According to the waterproof structure of the electronic device of this disclosure, an internal surface of the housing is provided with a step portion and a positioning latch disposed between the opening and the step portion, the inner frame is clamped between the step portion and the positioning latch to be fixed in the housing is fixed. The outer through opening is disposed on the housing, and the inner through opening is disposed on the inner frame.

According to the waterproof structure of the electronic device of this disclosure, the groove is provided with an outer peripheral wall, an inner peripheral wall and bottom wall, a top of the groove is an opened manner and adjacent to an inner periphery of the opening, the outer peripheral wall is disposed on the housing and the inner peripheral wall and the bottom wall are disposed on the inner frame. The outer peripheral wall is disposed on the housing, the outer through opening is disposed on the outer peripheral wall and the inner through opening is disposed on the bottom wall. Alternatively, the inner through opening may be disposed on the inner peripheral wall.

According to the waterproof structure of the electronic device of this disclosure, a closing latch is protruded from an internal surface of the housing, and the closing latch snaps at the cover. An external edge of the cover is mortised in the groove.

According to the waterproof structure of the electronic device of this disclosure, an external edge of the outer baffle and an internal edge of the outer through opening are mortised with each other. An external edge of the inner baffle and an internal edge of the inner through opening are mortised with each other. The cable includes a passing segment connected to the outer baffle and the inner baffle, and the passing segment is wrapped by the sealant.

Another waterproof structure of an electronic device is provided in this disclosure. The waterproof structure has a box, a cable, a sealant, and a cover. The box has an opening, the box is provided with a groove surrounding the opening, an outer through opening is defined on an external surface of the box communicating with the groove, the groove is provided with an inner through opening communicating with an internal space of the box. An outer baffle and an inner baffle are arranged on the cable respectively corresponding to the outer through opening and the inner through opening, the cable penetrates the box through the outer through opening and the inner through opening, and the outer through opening and the inner through opening are respectively closed by the outer baffle and the inner baffle. The sealant is filled in the groove. The cover covers the opening and closes the groove.

According to the waterproof structure of the electronic device of this disclosure, the groove is provided with an outer peripheral wall, an inner peripheral wall and bottom wall, a top of the groove is in an opened manner and adjacent to an outer periphery of the opening. The outer through opening is disposed on the outer peripheral wall and the inner through opening is disposed on the inner peripheral wall.

According to the waterproof structure of the electronic device of this disclosure, a closing latch is protruded from an internal surface of the housing, and the closing latch snaps at the cover. An external edge of the cover is mortised in the groove.

According to the waterproof structure of the electronic device of this disclosure, an external edge of the outer baffle and an internal edge of the outer through opening are mortised with each other. An external edge of the inner baffle and an internal edge of the inner through opening are mortised with each other. The cable includes a passing segment connected to the outer baffle and the inner baffle, and the passing segment is wrapped by the sealant.

According to the waterproof structure of the electronic device of this disclosure, the groove is disposed corresponding to the opening of the box to form a runner, the groove is provided with the outer through opening and the inner through opening for the cable to pass. The cable is disposed across the groove, and the outer through opening and the inner through opening are closed by the outer baffle and the inner baffle. The cover is assembled after the groove is filled with the sealant. Accordingly, the opening is sealed by the sealant and a position penetrated by the cable is sealed as well, and therefore additional waterproof structure for the cable is not needed. The sealant is restricted by the groove so that only a portion of the internal space in the box is potted, and a weight of the sealant may be effectively reduced.

BRIEF DESCRIPTION OF THE DRAWINGS

The features of the disclosure believed to be novel are set forth with particularity in the appended claims. The disclosure itself, however, may be best understood by reference to the following detailed description of the disclosure, which describes a number of exemplary embodiments of the disclosure, taken in conjunction with the accompanying drawings, in which:

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

Figure 1:
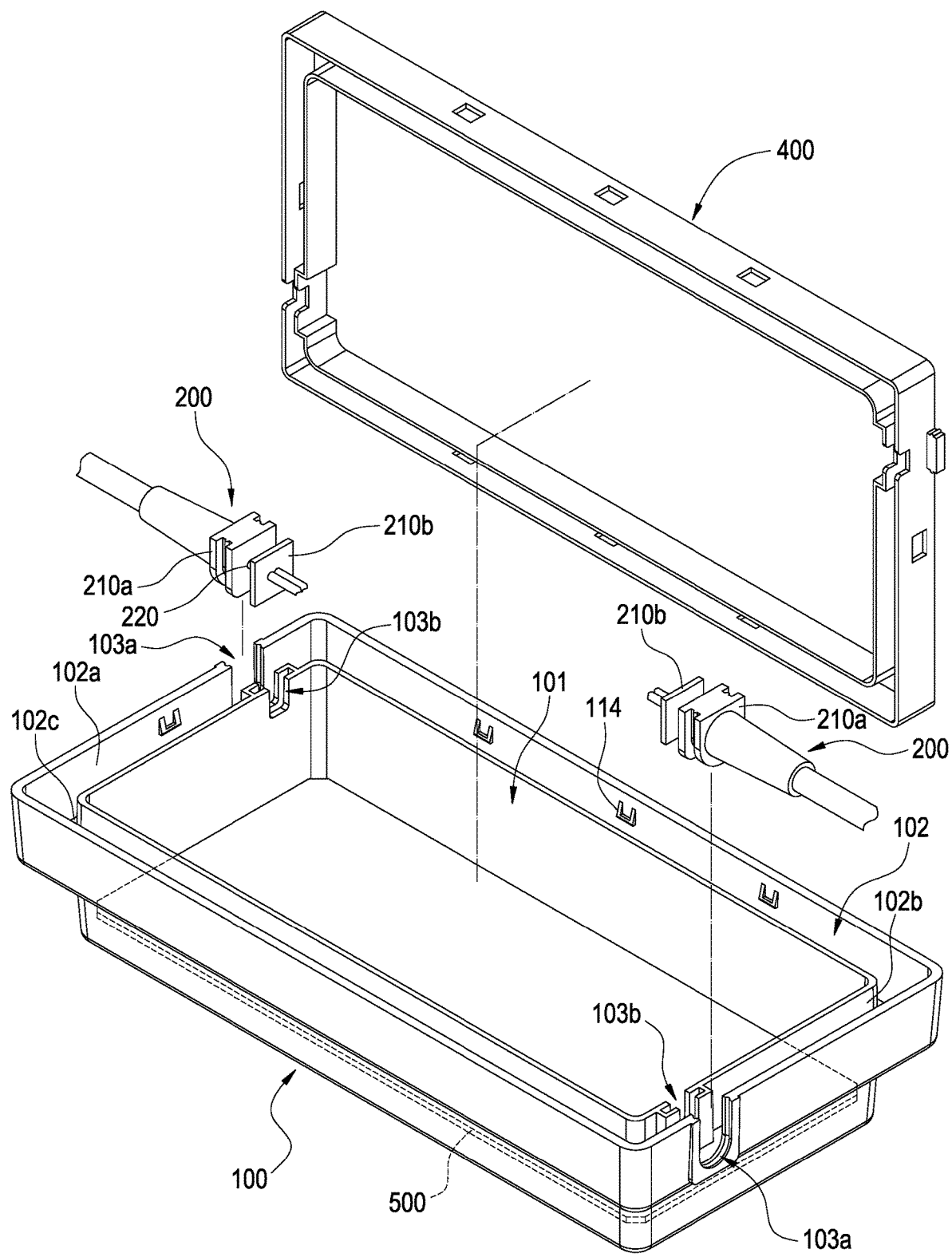
FIGS. 1 and 2 are exploded views showing a waterproof structure of an electronic device according to the first embodiment of this disclosure.
Figure 2:
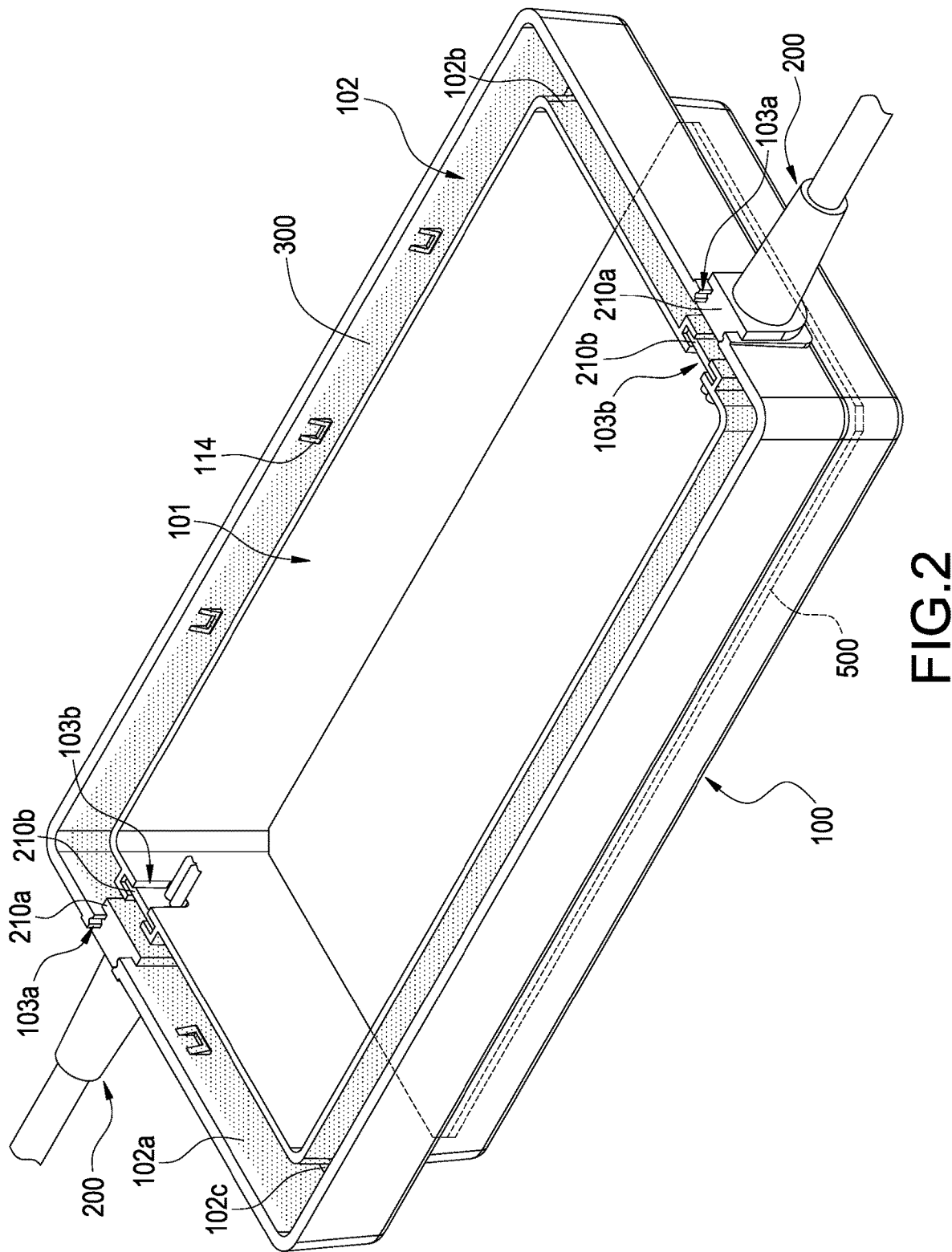
Figure 3:
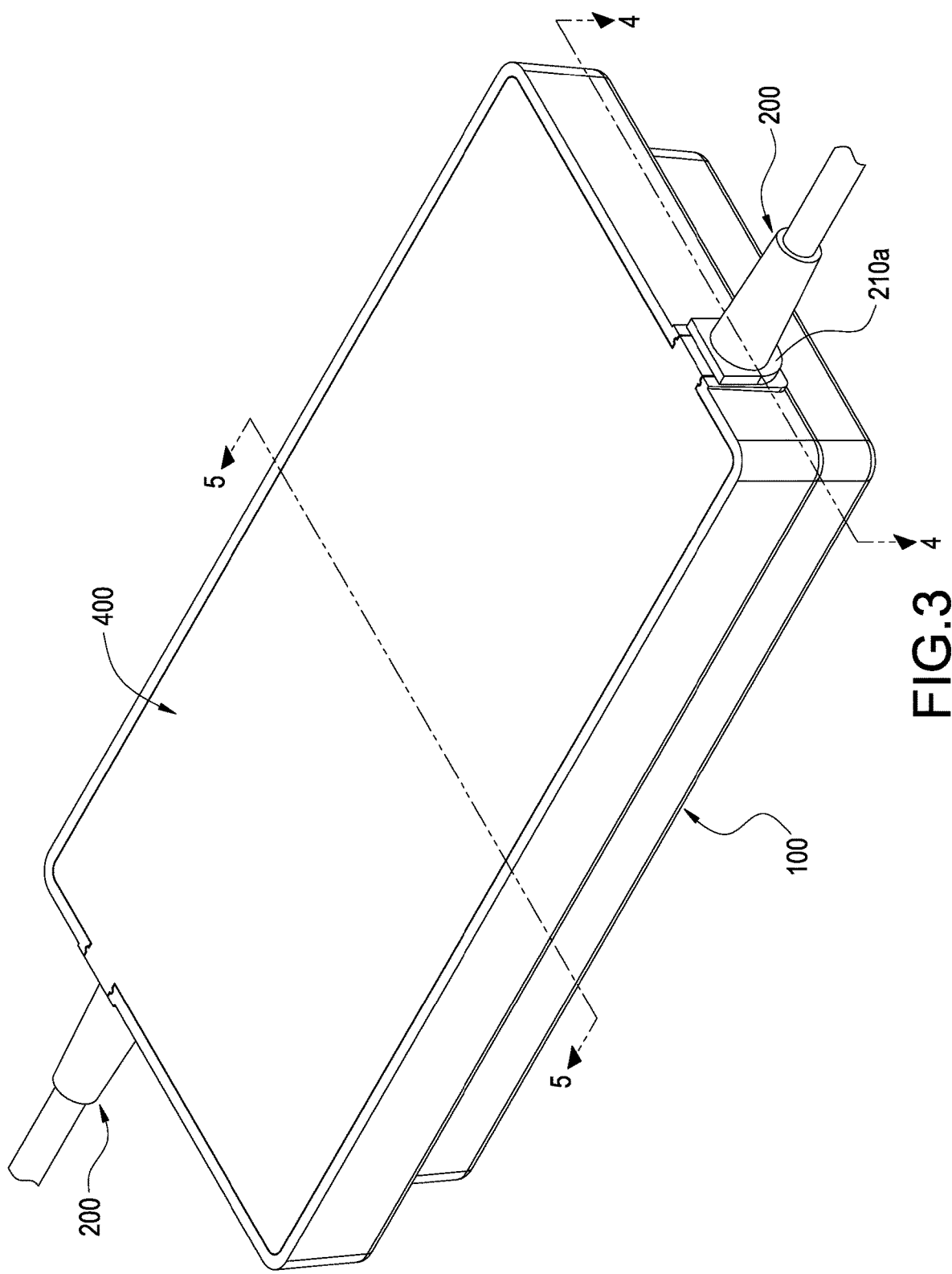
FIG. 3 is a perspective view showing the waterproof structure of the electronic device according to the first embodiment of this disclosure.
Figure 4:
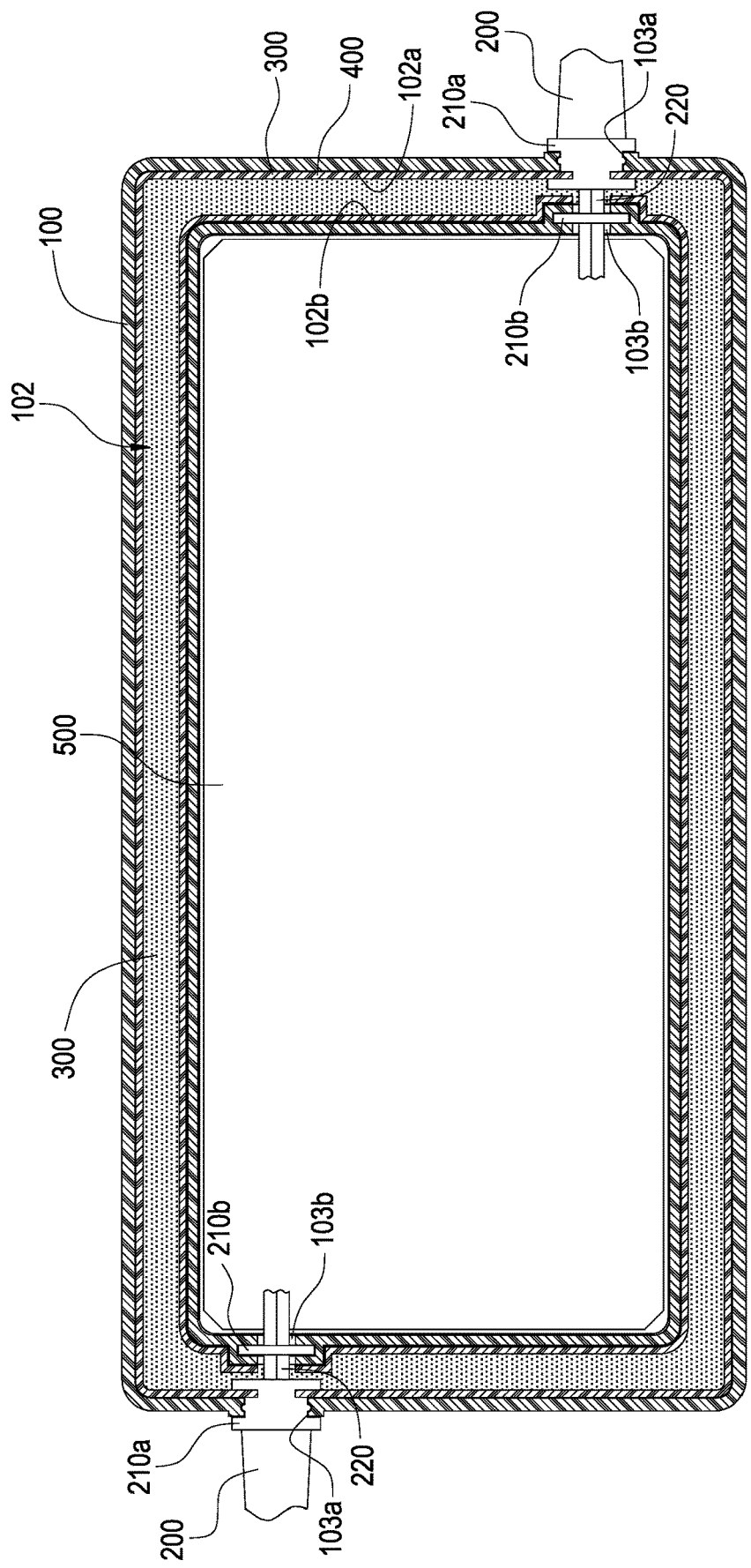
FIG. 4 is a cross-sectional view of the waterproof structure of the electronic device according to the first embodiment of this disclosure along a cross line 4-4 illustrated in FIG. 3.
Figure 5:
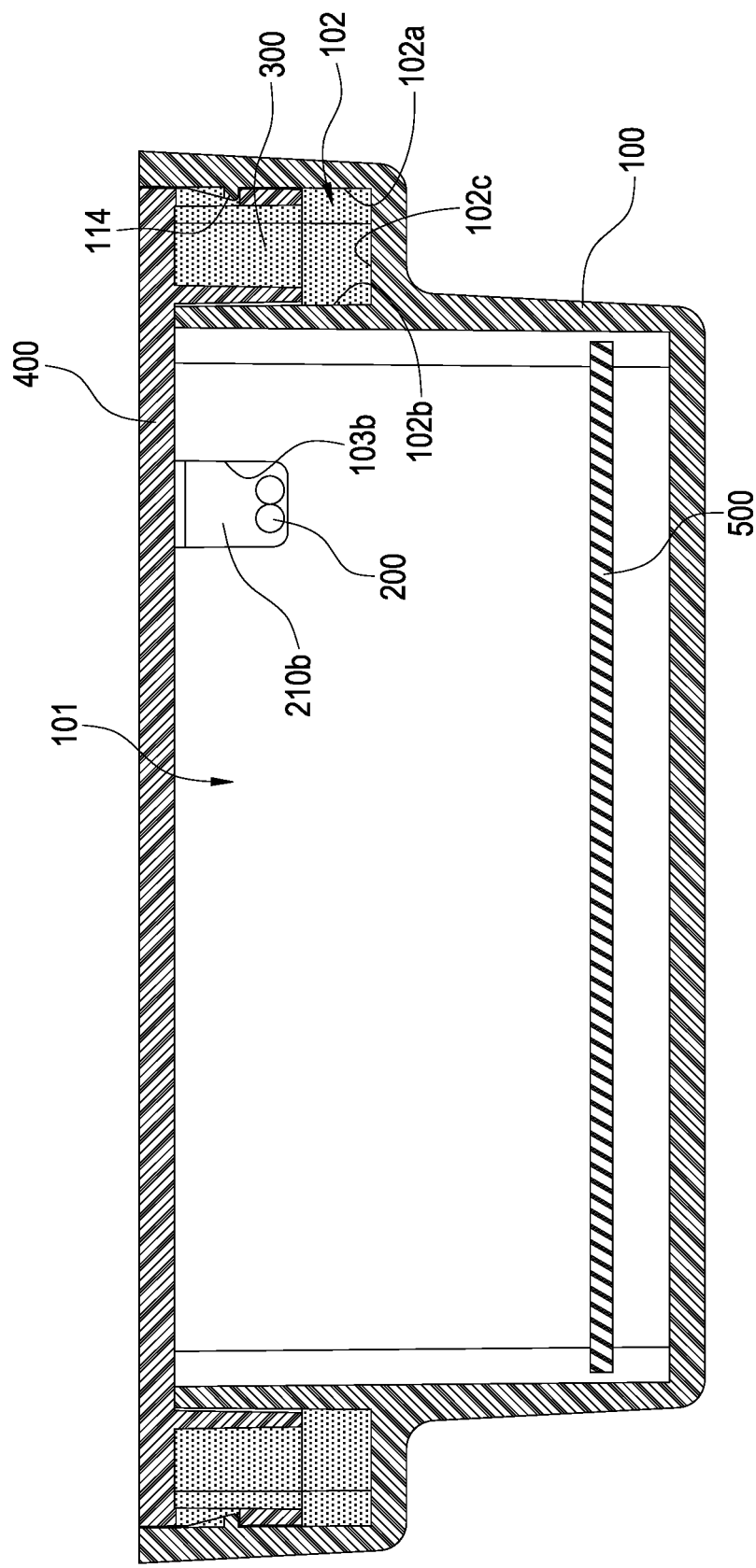
FIG. 5 is a cross-sectional view of the waterproof structure of the electronic device according to the first embodiment of this disclosure along a cross line 5-5 illustrated in FIG. 3.
Figure 6:
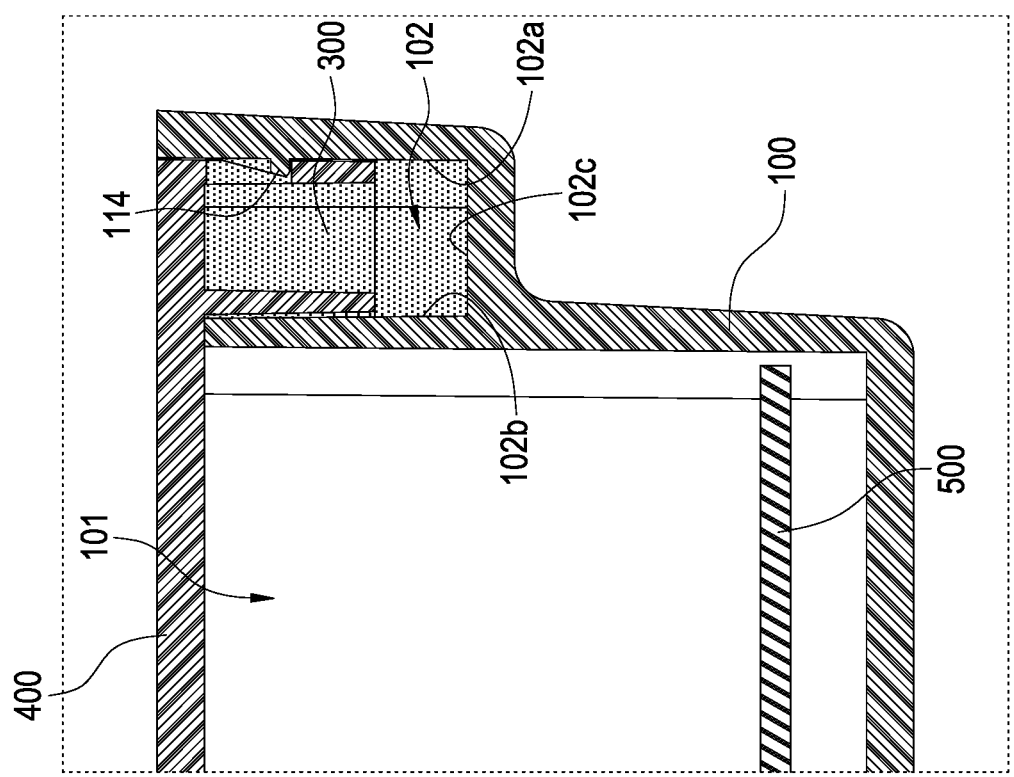
FIG. 6 is a partial enlarged view of FIG. 5.
Figure 7:
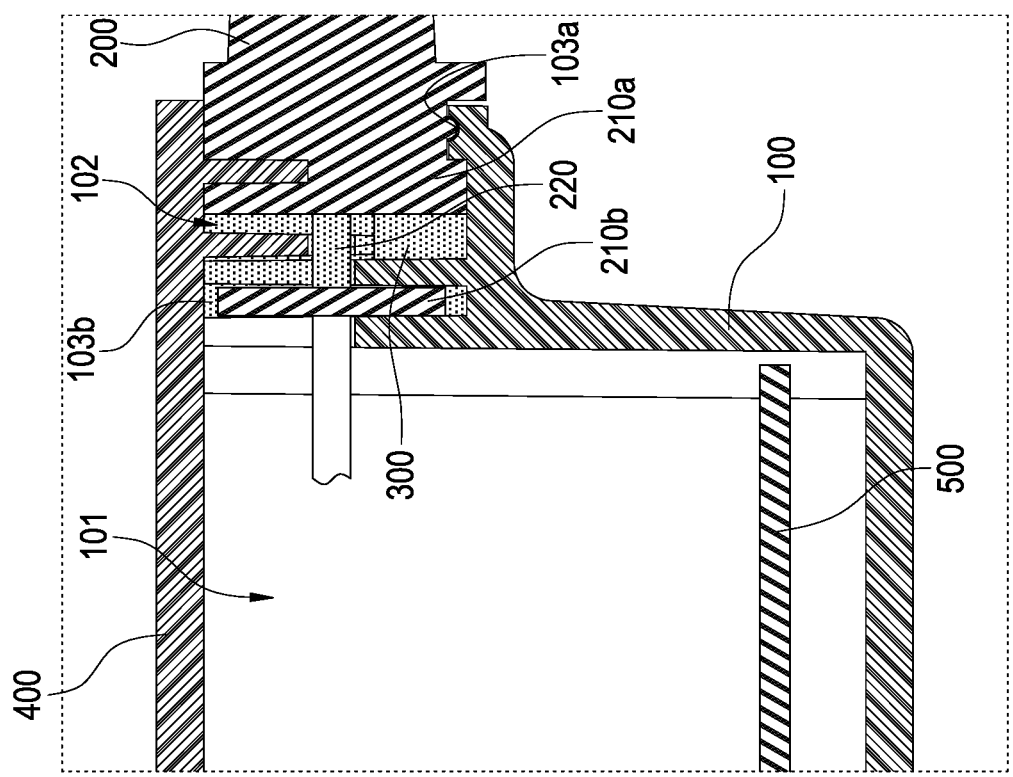
FIG. 7 is a cross-sectional view of a cable of the waterproof structure of the electronic device according to the first embodiment of this disclosure.

According to the first embodiment of this disclosure shown in FIGS. 1 to 3, a waterproof structure of the electronic device is provided. The waterproof structure has a box 100, a cable 200, a sealant 300 and a cover 400.

According to FIGS. 1 and 2, the box 100 has an opening 101 and a groove 102 defined on the box 100. The groove 102 is extended along an outer periphery of the opening 101 in a closed curve manner to surround the opening 101. According to this embodiment, the box 100 is formed as a one-piece plastic component by injection molding, but this disclosure should not be limited to the embodiment. The groove 102 alternatively may be defined on another separated component assembled to the outer periphery of the opening 101. The groove 102 is provided with an outer peripheral wall 102*a*, and inner peripheral wall 102*b* and a bottom wall 102*c*. The outer peripheral wall 102*a* surrounds the inner peripheral wall 102*b* and the outer peripheral wall 102*a* is separated from the inner peripheral wall 102*b*, the bottom wall 102*c* is connected to a lower edge of the outer peripheral wall 102*a* and a lower edge of the inner peripheral wall 102*b*, a top of the groove 102 is in an opened manner and adjacent to the outer periphery of the opening 101. An outer through opening 103*a* communicating to the groove 102 is defined on an external surface of the box 100, and the groove 102 is provided with an inner through opening 103*b* communicating with an internal space of the box 100. Specifically, the outer through opening 103*a* is disposed on the outer peripheral wall 102*a* and the inner through opening 103*b* is disposed on the inner peripheral wall 102*b*. Each of the outer through opening 103*a* and the inner through opening 103*b* may be a hole or a notch, and this disclosure should not be limited thereto.

According to FIGS. 1 to 2, 4 and 7, the cable 200 penetrates the box 100 through the outer through opening 103*a* and the inner through opening 103*b*, a circuit board 500 is arranged in the box 100, one end of the cable 200 disposed in the box 100 is connected to the circuit board 500. An outer baffle 210*a* and an inner baffle 210*b* are arranged on the cable 200 respectively corresponding to the outer through opening 103*a* and the inner through opening 103*b*, the outer baffle 210*a* and the inner baffle 210*b* are laterally extended from a lateral surface of the cable 200, and the outer through opening 103*a* and the inner through opening 103*b* are respectively closed by the outer baffle 210*a* and the inner baffle 210*b*. According to this embodiment, an external edge of the outer baffle 210*a* and an internal edge of the outer through opening 103*a* are mortised with each other, and an external edge of the inner baffle 210*b* and an internal edge of the inner through opening 103*b* are mortised with each other. Therefore, the outer through opening 103*a* and the inner through opening 103*b* are fully closed, and the cable 200 is positioned. The structure of the outer baffle 210*a* and inner baffle 210*b* for closing the outer through opening 103*a* and the inner through opening 103*b* of this disclosure should not be limited to this embodiment. For example, the outer baffle 210a alternatively may press on a side of the outer through opening 103a to close the outer through opening 103a, the inner baffle 210b may similarly press on a side of the inner through opening 103b to close the inner through opening 103b. The cable 200 has a passing segment 220 connected to the outer baffle 210a and inner baffle 210b, the passing segment 220 is accommodated in the groove 102 and movable, and therefore the relative positions of the outer baffle 210a and the inner baffle 210b are not limited. Accordingly, the passing segment 220 may be bent corresponding to the relative positions of the outer through opening 103a and the inner through opening 103b so that the outer baffle 210a and the inner baffle 210b may be located at positions corresponding to the outer through opening 103a and the inner through opening 103b.

According to FIGS. 2 to 7, the sealant 300 is filled in the groove 102, specifically, the sealant 300 may be injected to the groove 102 through any spots on the top the groove 102 and spreads along the groove 102 until the groove 102 is filled. Therefore, the passing segment 220 may be fully wrapped in the sealant 300 according to FIG. 7.

According to FIGS. 1 to 3, the cover 400 covers the opening 101 and closes the groove 102. Specifically, the cover 400 is assembled onto the box 100 before the sealant 300 is cured. The sealant 300 is sealed with the cover 400 after curing so as to seal the opening 101, and the outer baffle 210a may be pressed by the cover 400. Therefore, the outer baffle 210a is fixed on the box 100 so that the cable 200 may not be loosened by tugging. According to FIGS. 1 and 5 to 6, a closing latch 114 is protruded from an internal surface of the housing 110, an external edge of the cover 400 is mortised in the groove and embedded in the sealant 300, and the closing latch 114 snaps at the cover 400 so that the connecting strength and sealing level between the cover 400 and the box 100 may be improved.

Figure 8:
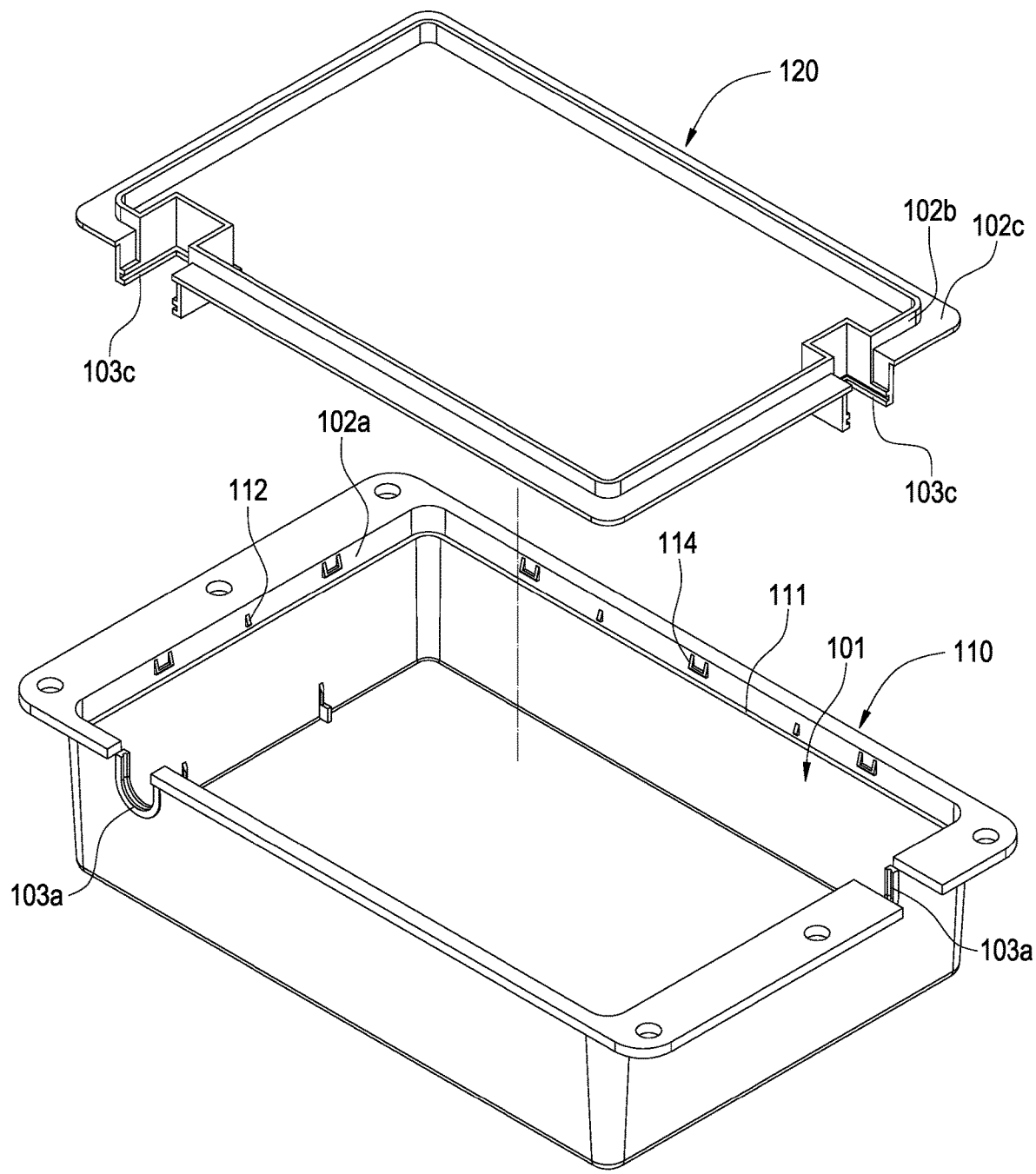
FIGS. 8 to 10 are exploded views showing a waterproof structure of an electronic device according to the second embodiment of this disclosure.
Figure 9:
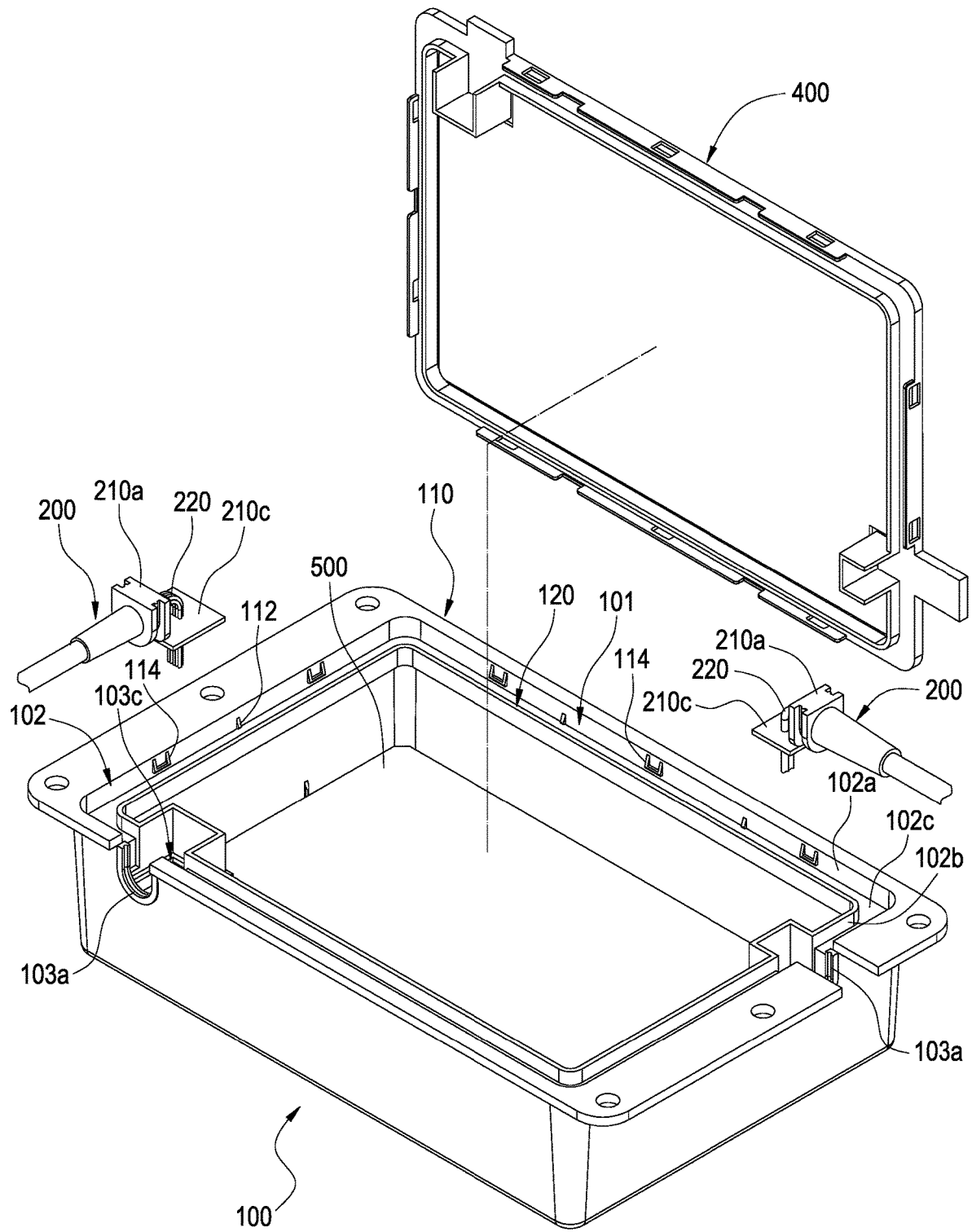
Figure 10:
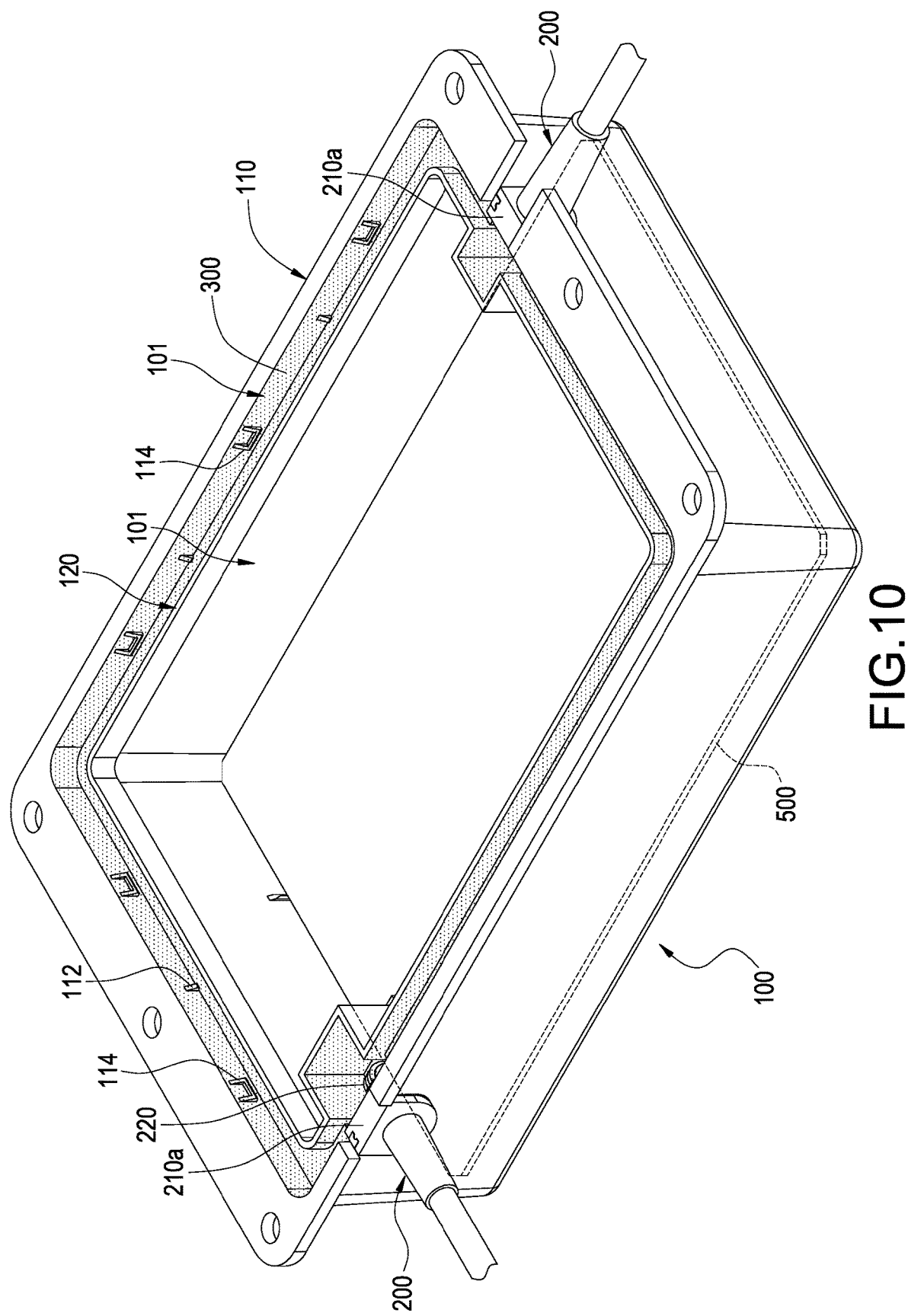
Figure 11:
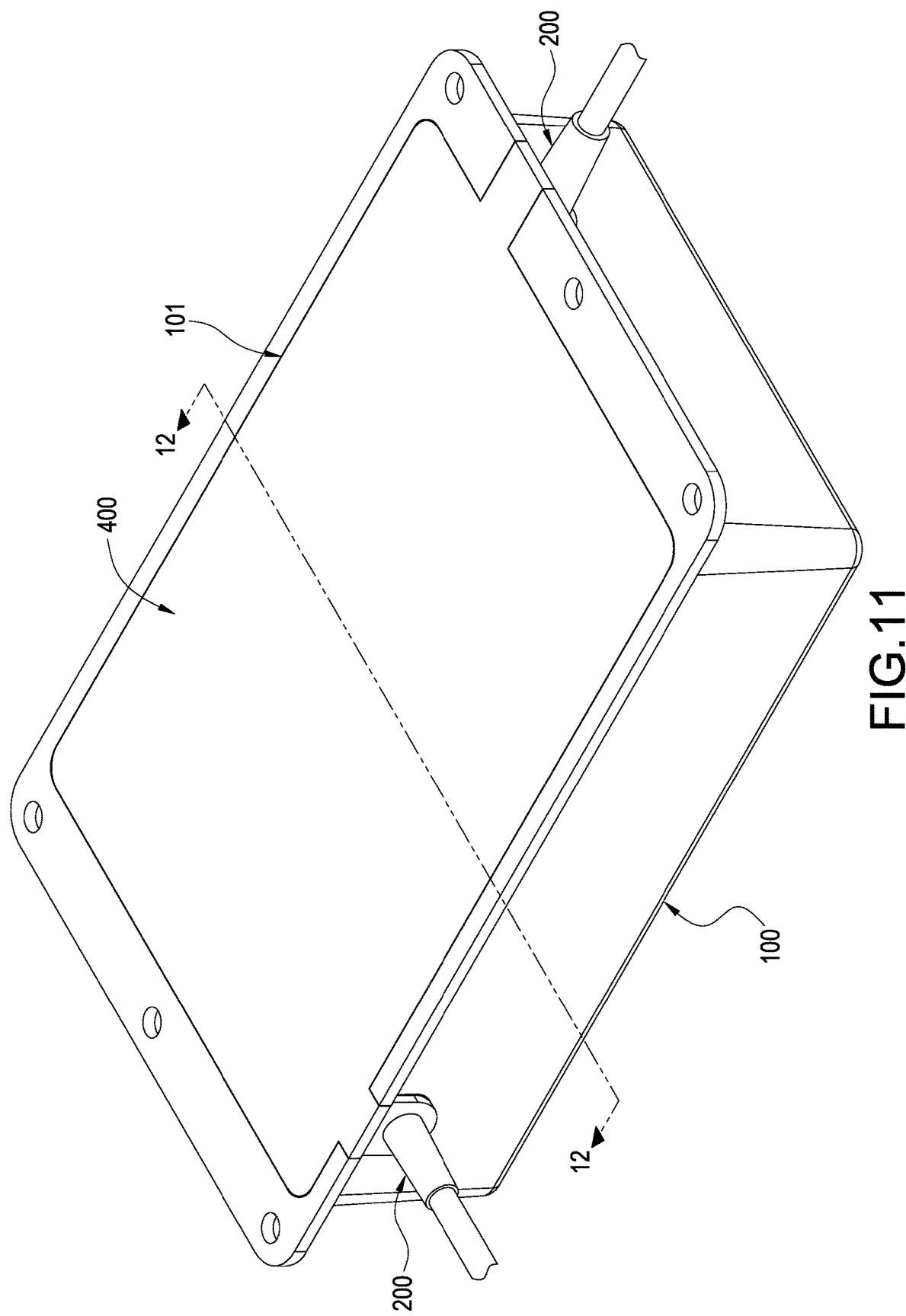
FIG. 11 is a perspective view showing the waterproof structure of the electronic device according to the second embodiment of this disclosure.
Figure 12:
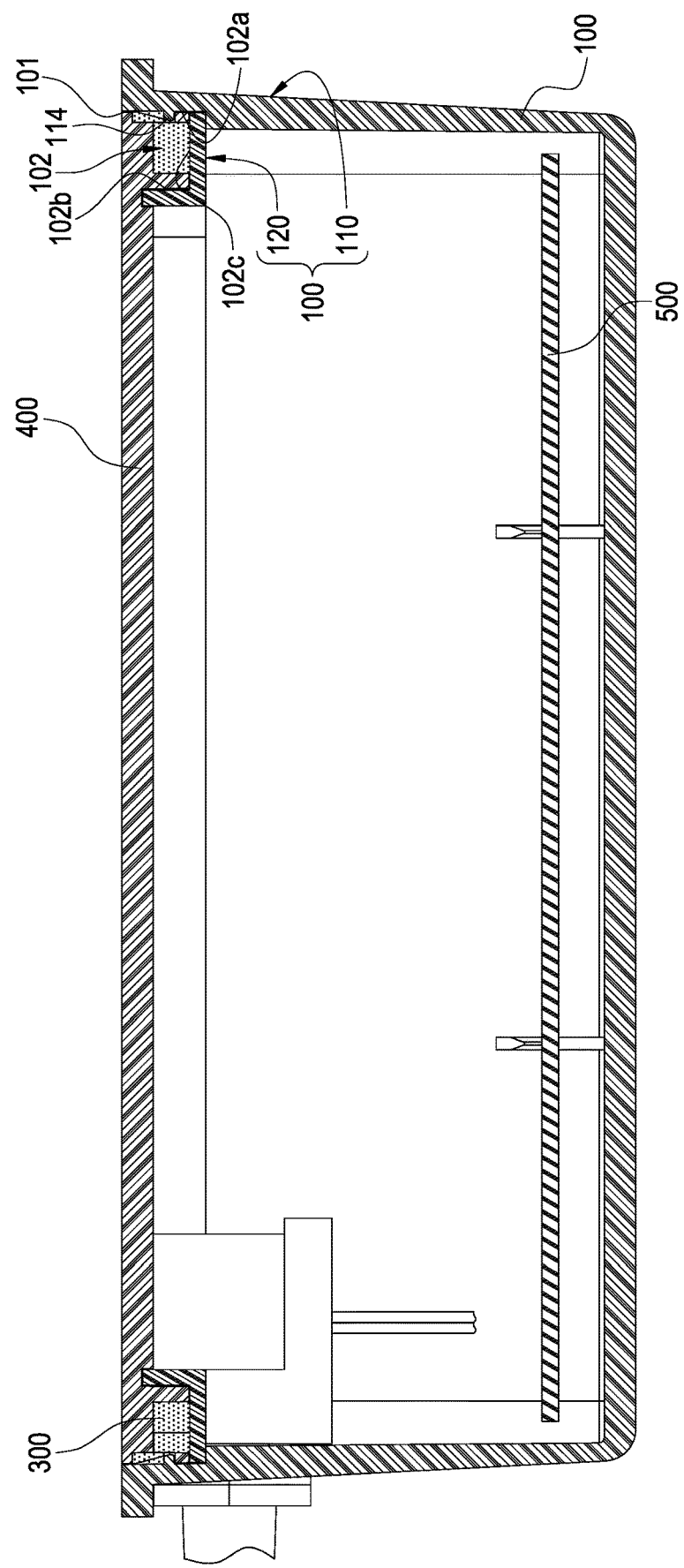
FIG. 12 is a cross-sectional view of the waterproof structure of the electronic device according to the second embodiment of this disclosure along a cross line 12-12 illustrated in FIG. 11.
Figure 13:
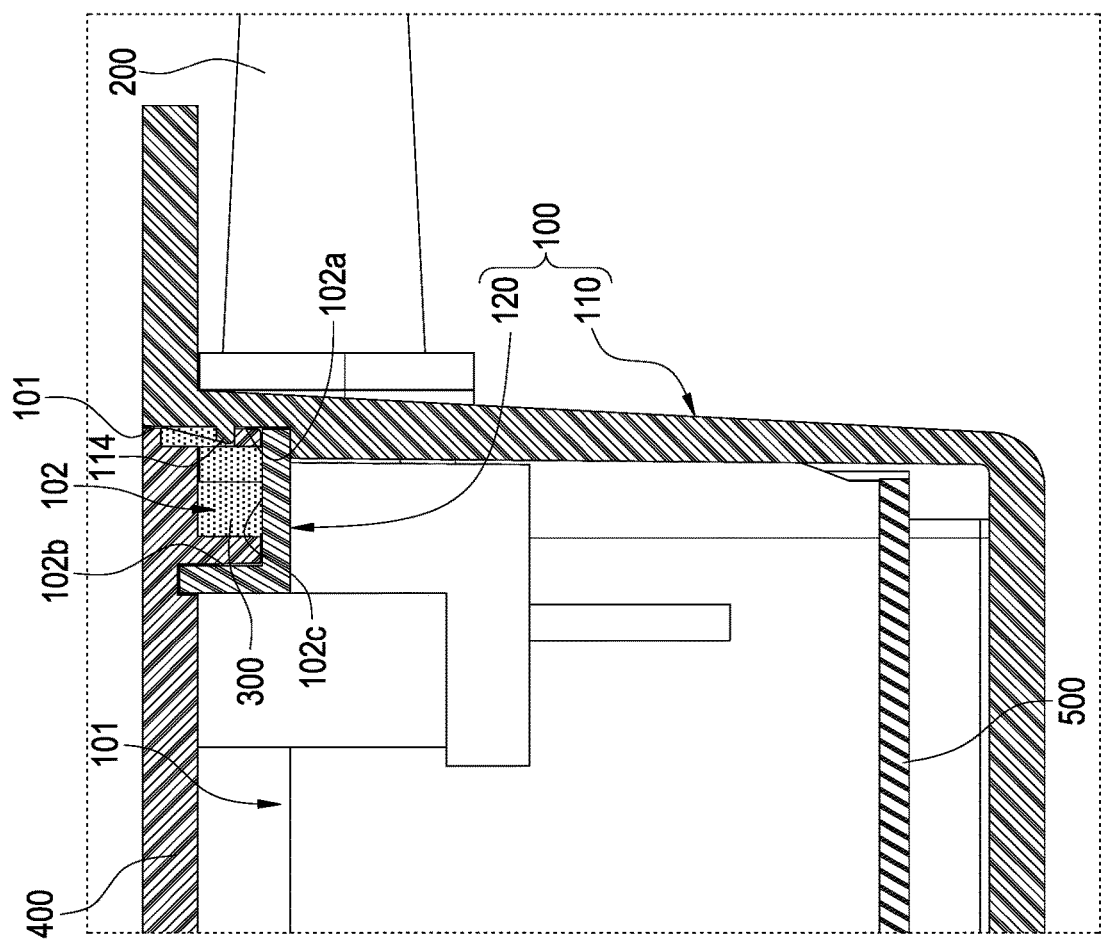
FIG. 13 is a partial enlarged view of FIG. 12.
Figure 14:
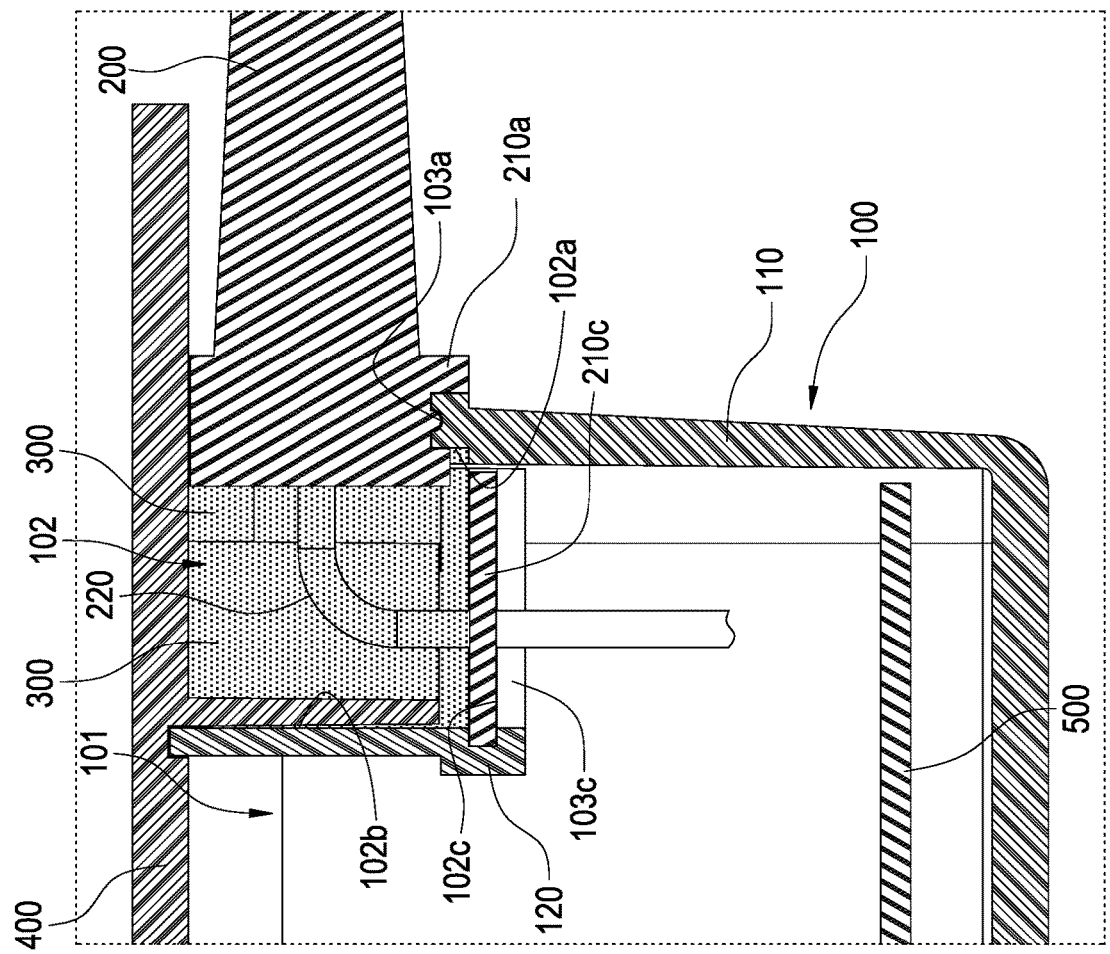
FIG. 14 is a cross-sectional view of a cable of the waterproof structure of the electronic device according to the second embodiment of this disclosure.

According to the second embodiment of this disclosure shown in FIGS. 8 to 10, a waterproof structure of the electronic device is provided. The waterproof structure has a box 100, a cable 200, a sealant 300 and a cover 400.

The box 100 has an opening 101 and a groove 102 defined on the box 100. The groove 102 is extended along an inner periphery of the opening 101 in a closed curve manner. The groove 102 is disposed on the inner periphery of the opening 101 so that the external protruding structures of the box 100 may be reduced. The groove 102 has an outer peripheral wall 102a, an inner peripheral wall 102b and a bottom wall 102c, the outer peripheral wall 102a surrounds the inner peripheral wall 102b and the outer peripheral wall 102a is separated from the inner peripheral wall 102b, the bottom wall 102c is connected to a lower edge of the outer peripheral wall 102a and a lower edge of the inner peripheral wall 102b, a top of the groove 102 is in an opened manner and adjacent to the inner periphery of the opening 101. An outer through opening 103a communicating to the groove 102 is defined on an external surface of the box 100, and the groove 102 is provided with an inner through opening 103c communicating with an internal space of the box 100. Specifically, the outer through opening 103a is disposed on the outer peripheral wall 102a and the inner through opening 103c is disposed on the bottom wall 102c.

According to this embodiment, the groove 102 is disposed on the inner periphery of the opening 101 to form an internal protruding structure, and the box 100 is separated into a housing 110 and an inner frame 120 to facilitate a demolding process. The opening 101 is defined on the housing 110, and the inner frame 120 is arranged on an inner periphery of the opening 101. A step portion 111 and a positioning latch 112 disposed between the opening 101 and the step portion 111 are protruded from an internal surface of the housing 110, the inner frame 120 is clamped between the step portion 111 and the positioning latch 112 to be fixed in the housing 110. According to this embodiment, the outer peripheral wall 102a is disposed on the housing 110, and the inner peripheral wall 102b and the bottom wall 102c are disposed on the inner frame 120 so that the outer through opening 103a is defined on the housing 110 and the inner through opening 103c is defined on the inner frame 120. Each of the outer through opening 103a and the inner through opening 103b may be a hole or a notch, and this disclosure should not be limited thereto.

The cable 200 penetrates the box 100 through the outer through opening 103a and the inner through opening 103c, a circuit board 500 is arranged in the box 100, one end of the cable 200 disposed in the box 100 is connected to the circuit board 500. An outer baffle 210a and an inner baffle 210c are arranged on the cable 200 respectively corresponding to the outer through opening 103a and the inner through opening 103c, the outer baffle 210a and the inner baffle 210c are laterally extended from a lateral surface of the cable 200, and the outer through opening 103a and the inner through opening 103c are respectively closed by the outer baffle 210a and the inner baffle 210c. According to this embodiment, an external edge of the outer baffle 210a and an internal edge of the outer through opening 103a are mortised with each other, and an external edge of the inner baffle 210c and an internal edge of the inner through opening 103c are mortised with each other. Therefore, the outer through opening 103a and the inner through opening 103c are fully closed, and the cable 200 is positioned. The structure of the outer baffle 210a and inner baffle 210c for closing the outer through opening 103a and the inner through opening 103c of this disclosure should not be limited to this embodiment. For example, the outer baffle 210a alternatively may press on a side of the outer through opening 103a to close the outer through opening 103a, the inner baffle 210c may similarly press on a side of the inner through opening 103c to close the inner through opening 103c. The cable 200 has a passing segment 220 connected to the outer baffle 210a and inner baffle 210c, the passing segment 220 is accommodated in the groove 102 and movable, and the relative positions of the outer baffle 210a and the inner baffle 210c are not limited. Accordingly, the passing segment 220 may be bent corresponding to the relative positions of the outer through opening 103a and the inner through opening 103b so that the outer baffle 210a and the inner baffle 210c may be located at positions corresponding to the outer through opening 103a and the inner through opening 103c.

According to FIGS. 10 to 14, the sealant 300 is filled in the groove 102, specifically, the sealant 300 may be injected to the groove 102 through any spots on the top the groove 102 and spreads along the groove 102 until the groove 102 is filled. Therefore, the passing segment 220 may be fully wrapped in the sealant 300 according to FIG. 14.

The cover 400 covers the opening 101 and closes the groove 102. Specifically, the cover 400 is assembled onto the box 100 before the sealant 300 is cured. The sealant 300 is sealed with the cover 400 after curing so as to seal the opening 101, and the outer baffle 210a may be pressed by the cover 400. Therefore, the outer baffle 210a is fixed on the box 100 so that the cable 200 may not be loosened by tugging. According to FIGS. 9 and 12 to 13, a closing latch 114 is protruded from an internal surface of the housing 110, an external edge of the cover 400 is mortised in the groove and embedded in the sealant 300, and the closing latch 114 snaps on the cover 400 so that the connecting strength and sealing level between the cover 400 and the box 100 may be improved.

Specifically, according to FIG. 9, a depth of the closing latch 114 located in the groove 102 is closer to the opening 101 comparing to a depth of the positioning latch 112 located in the groove 102. The positioning latch 112 is used for pressing the bottom wall 102c and therefore should be disposed at a bottom of the groove 102. However, the closing latch 114 illustrated in FIG. 13 should be separated from the bottom wall 102c for snapping at the cover 400.

According to the waterproof structure of the electronic device of this disclosure, the groove 102 is disposed corresponding to the opening 101 of the box 100 to form a runner, the groove 102 is provided with the outer through opening 103a and the inner through opening 103b/103c for the cable 200 to pass. The cable 200 is disposed across the groove 102, and the outer through opening 103a and the inner through opening 103b/103c are closed by the outer baffle 210a and the inner baffle 210b/210c. The cover 400 is assembled after the groove 102 is filled with the sealant 300. Accordingly, the opening 101 is sealed by the sealant 300 and a position penetrated by the cable 200 is sealed as well, and therefore additional waterproof structure for the cable 200 is not needed. The sealant 300 is restricted by the groove 102 so that only a portion of the internal space in the box 100 is potted, and a weight of the sealant 300 may be effectively reduced.

While this disclosure has been described by means of specific embodiments, numerous modifications and variations could be made thereto by those skilled in the art without departing from the scope and spirit of this disclosure set forth in the claims.

What is claimed is:

1. A waterproof structure of an electronic device, the waterproof structure comprising:
   a box, comprising a housing and an inner frame, an opening disposed on the housing, the inner frame arranged in the opening, a groove extended along an inner periphery of the opening, the groove extended in a closed curve manner, an outer through opening defined on an external surface of the box communicating with the groove, an inner through opening disposed on the groove communicating with an internal space of the box;
   a cable, comprising an outer baffle and an inner baffle respectively corresponding to the outer through opening and the inner through opening, the cable penetrating the box through the outer through opening and the inner through opening, and the outer through opening and the inner through opening respectively closed by the outer baffle and the inner baffle;
   a sealant, filled in the groove; and
   a cover, covering the opening and closing the groove.

2. The waterproof structure of the electronic device according to claim 1, wherein the housing comprises a step portion disposed protrusively on an internal surface thereof and a positioning latch disposed protrusively between the opening and the step portion, the inner frame is clamped between the step portion and the positioning latch and is fixed in the housing.

3. The waterproof structure of the electronic device according to claim 1, wherein the outer through opening is disposed on the housing, and the inner through opening is disposed on the inner frame.

4. The waterproof structure of the electronic device according to claim 1, wherein the groove comprises an outer peripheral wall, an inner peripheral wall and a bottom wall, a top of the groove is in an opened manner and adjacent to the inner periphery of the opening, the outer peripheral wall is disposed on the housing and the inner peripheral wall and the bottom wall are disposed on the inner frame.

5. The waterproof structure of the electronic device according to claim 4, wherein the outer through opening is disposed on the outer peripheral wall and the inner through opening is disposed on the bottom wall.

6. The waterproof structure of the electronic device according to claim 4, wherein the outer through opening is disposed on the outer peripheral wall and the inner through opening is disposed on the inner peripheral wall.

7. The waterproof structure of the electronic device according to claim 1, wherein a closing latch is protruded from an internal surface of the housing, and the closing latch snaps at the cover.

8. The waterproof structure of the electronic device according to claim 7, wherein an external edge of the cover is mortised in the groove.

9. The waterproof structure of the electronic device according to claim 1, wherein an external edge of the outer baffle and an internal edge of the outer through opening are mortised with each other.

10. The waterproof structure of the electronic device according to claim 1, wherein an external edge of the inner baffle and an internal edge of the inner through opening are mortised with each other.

11. The waterproof structure of the electronic device according to claim 1, wherein the cable comprises a passing segment connected between the outer baffle and the inner baffle, and the passing segment is wrapped by the sealant.

12. A waterproof structure of an electronic device, the waterproof structure comprising:
    a box, comprising an opening and a groove surrounding the opening, an outer through opening defined on an external surface of the box communicating with the groove, the groove comprising an inner through opening communicating with an internal space of the box;
    a cable, comprising an outer baffle and an inner baffle arranged respectively corresponding to the outer through opening and the inner through opening, wherein the cable penetrates the box through the outer through opening and the inner through opening, and the outer through opening and the inner through opening are respectively closed by the outer baffle and the inner baffle;
    a sealant, filled in the groove; and
    a cover, covering the opening and closing the groove.

13. The waterproof structure of the electronic device according to claim 12, wherein the groove comprises an outer peripheral wall, an inner peripheral wall and bottom wall, a top of the groove is in an opened manner and adjacent to an outer periphery of the opening.

14. The waterproof structure of the electronic device according to claim 13, wherein the outer through opening is disposed on the outer peripheral wall and the inner through opening is disposed on the inner peripheral wall.

15. The waterproof structure of the electronic device according to claim 13, wherein a closing latch is protruded from an internal surface of the box, and the closing latch snaps at the cover.

16. The waterproof structure of the electronic device according to claim 13, wherein an external edge of the cover is mortised in the groove.

17. The waterproof structure of the electronic device according to claim 13, wherein an external edge of the outer baffle and an internal edge of the outer through opening are mortised with each other.

18. The waterproof structure of the electronic device according to claim 13, wherein an external edge of the inner baffle and an internal edge of the inner through opening are mortised with each other.

19. The waterproof structure of the electronic device according to claim 13, wherein the cable comprises a passing segment connected between the outer baffle and the inner baffle, and the passing segment is wrapped by the sealant.

\* \* \* \* \*